(12) United States Patent
Davis et al.

(10) Patent No.: US 6,870,379 B1
(45) Date of Patent: Mar. 22, 2005

(54) INDIRECT STIMULATION OF AN INTEGRATED CIRCUIT DIE

(75) Inventors: Brennan V. Davis, Austin, TX (US);
Victoria J. Bruce, Austin, TX (US);
Michael R. Bruce, Austin, TX (US);
Rosalinda M. Ring, Hillsboro, OR (US); David H. Eppes, Austin, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 10/164,739

(22) Filed: Jun. 6, 2002

Related U.S. Application Data
(60) Provisional application No. 60/307,995, filed on Jul. 26, 2001.

(51) Int. Cl.[7] .................. G01R 31/302; G01R 31/26
(52) U.S. Cl. ................ 324/752; 324/750; 324/765
(58) Field of Search ................ 324/750–752, 324/765; 250/306–307, 310–311, 492.1, 492.21; 356/73, 401; 438/14–18

(56) References Cited

U.S. PATENT DOCUMENTS

| | | | | |
|---|---|---|---|---|
| 6,107,107 A | * | 8/2000 | Bruce et al. | 438/14 |
| 6,122,042 A | * | 9/2000 | Wunderman et al. | 356/73 |
| 6,387,715 B1 | * | 5/2002 | Davis et al. | 438/16 |
| 6,417,680 B1 | * | 7/2002 | Birdsley et al. | 324/752 |
| 6,529,018 B1 | * | 3/2003 | Stevens | 324/750 |
| 6,545,490 B1 | * | 4/2003 | Bruce | 324/750 |
| 6,599,762 B1 | * | 7/2003 | Eppes | 438/14 |

* cited by examiner

Primary Examiner—Minh N. Tang

(57) ABSTRACT

Analysis of a semiconductor die is enhanced by the stimulation the die and the detection of a response to the stimulation. According to an example embodiment of the present invention, a semiconductor die is analyzed using indirect stimulation of a portion of the die, and detecting a response therefrom. First, selected portion of circuitry within the die is stimulated. The stimulation of the selected portion induces a second portion of circuitry within the die to generate an external emission. The emission is detected and the die is analyzed therefrom. In one particular implementation, a response from the selected portion is inhibited from interfering with the detection of the emission from the second portion of circuitry.

26 Claims, 3 Drawing Sheets

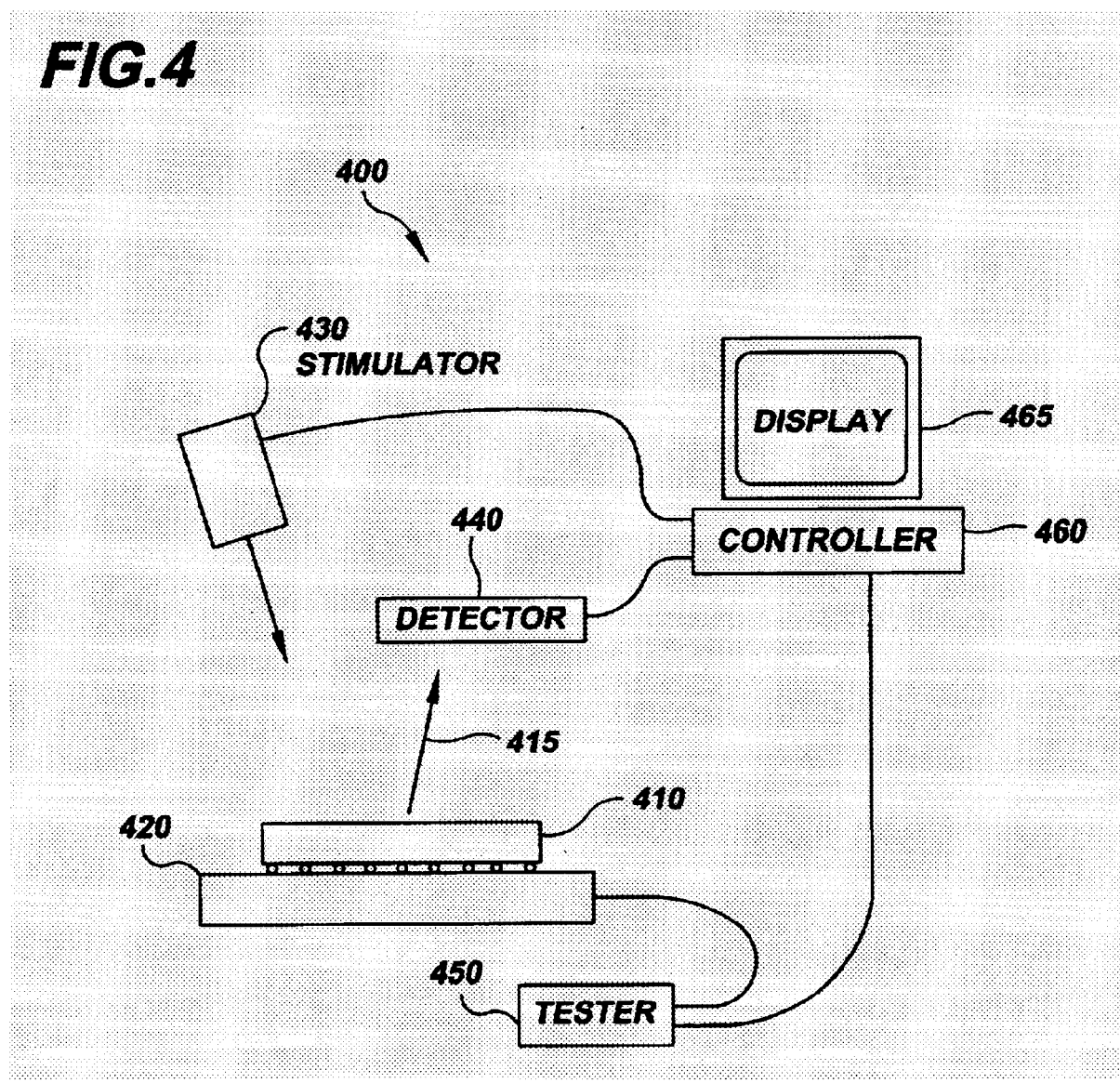

INDIRECT STIMULATION OF AN INTEGRATED CIRCUIT DIE

This is a conversion of U.S. Provisional Patent Application Ser. No. 60/307,995, filed on Jul. 26, 2001, to which Applicant claims priority under 35 U.S.C. § 119(e).

FIELD OF THE INVENTION

The present invention relates generally to semiconductor dies and their fabrication and, more particularly, to analysis of semiconductor dies involving secondary effects of circuit stimulation.

BACKGROUND OF THE INVENTION

The semiconductor industry has recently experienced technological advances that have permitted dramatic increases in integrated circuit density and complexity, and equally dramatic decreases in power consumption and package sizes. Present semiconductor technology now permits single-chip microprocessors with many millions of transistors, operating at speeds of hundreds of millions of instructions per second to be packaged in relatively small, air-cooled semiconductor device packages.

A by-product of such high-density and high functionality is an increased demand for products employing these microprocessors and devices for use in numerous applications. As the use of these devices has become more prevalent, the demand for faster operation and better reliability has increased. Such devices often require manufacturing processes that are highly complex and expensive.

As the manufacturing processes for semiconductor devices and integrated circuits increase in difficulty, methods for testing and debugging these devices become increasingly important. Not only is it important to ensure that individual chips are functional, it is also important to ensure that batches of chips perform consistently. In addition, the ability to detect a defective manufacturing process early is helpful for reducing the number of defective devices manufactured.

While various testing methods and arrangements are available for semiconductor die analysis, the improvement upon these methods and arrangements, as well as the discovery of new manners of achieving such testing, presents a challenge to the growth and improvement of semiconductor technologies.

SUMMARY OF THE INVENTION

The present invention is directed to a method and system for analyzing a semiconductor die in a manner that enhances the ability to detect and analyze responses from selected portions of circuitry within the die. The present invention is exemplified in a number of implementations and applications, some of which are summarized below.

According to an example embodiment of the present invention, a semiconductor die is analyzed using secondary stimulation of a portion of the die and detecting a response therefrom. First, selected portion of circuitry within the die is stimulated. The stimulation induces a second portion of circuitry within the die to generate a detectable external emission. The emission is detected and the die is analyzed therefrom.

In another example embodiment of the present invention, the first stimulated portion of circuitry also generates a response. In this particular implementation, the response from the selected circuitry is inhibited, such as by using a filter. In this manner, the detection of the emission from the secondary portion of circuitry is enhanced by the inhibition of interference or other potential problems presented by the response from the first selected portion of circuitry.

In still another example embodiment of the present invention, a system is adapted to indirectly stimulate a portion of circuitry in a semiconductor die. The system includes a stimulation arrangement adapted to stimulate a first portion of circuitry in the die. An external emission from a second portion of circuitry in the die is induced as a function of the stimulation, and a detector is adapted to detect the emission. A filter is placed between the die and the detector and is adapted to inhibit any response from the first portion of circuitry while allowing the emission from the second portion of circuitry to be detected.

The above summary of the present invention is not intended to describe each illustrated embodiment or every implementation of the present invention. The figures and detailed description that follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIG. 4 is a system for analyzing a semiconductor die, according to another example embodiment of the present invention.

Figure 1:
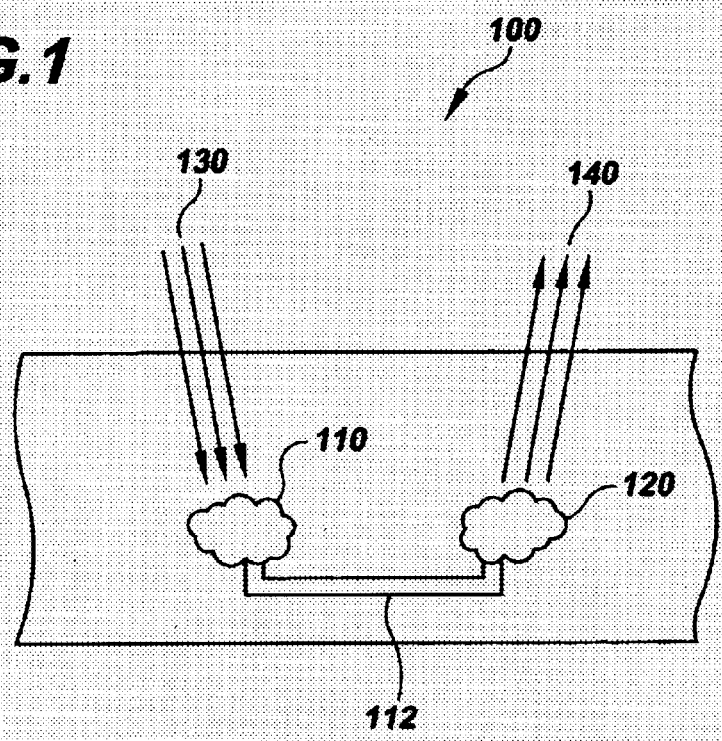
FIG. 1 is a semiconductor die undergoing analysis, according to an example embodiment of the present invention.

While the invention is amenable to various modifications and alternative forms, specifics thereof have been shown by way of example in the drawings and will be described in detail. It should be understood, however, that the intention is not necessarily to limit the invention to the particular embodiments described. On the contrary, the intention is to cover all modifications, equivalents, and alternatives falling within the spirit and scope of the invention as defined by the appended claims.

DETAILED DESCRIPTION

The present invention is believed to be applicable to a variety of different types of semiconductor devices, and has been found particularly suited for semiconductor dies requiring or benefiting from circuit analysis through indirect stimulation. While the present invention is not necessarily limited to such devices, various aspects of the invention may be appreciated through a discussion of various examples using this context.

According to an example embodiment of the present invention, a selected portion of circuitry in a semiconductor die is stimulated. The stimulation generates an external emission from a second portion of circuitry in the die. The circuitry includes one or more selected regions, such as a source/drain region of a transistor. The emission may be indicative, for example, of a change in electrical state such as a current, voltage or resistive change. The emission is detected and used to analyze the die. In the manner, indirect stimulation is used to generate a response for effecting analysis of a semiconductor die.

In a more particular example implementation of the present invention, the selected portion of circuitry that is stimulated also generates a response, such as a reflection or an emission. This response can interfere with the detection of an emission from the second portion of circuitry. In this implementation, the response from the stimulated portion of circuitry is inhibited or eliminated, enhancing the detection of an emission from the second portion of circuitry. The inhibition of the response from the stimulated circuitry is accomplished using a method and arrangement, such as a filter, suited to the type of stimulation being used.

As an alternative or in addition to inhibiting a response from the first portion of circuitry, another example embodiment of the present invention involves selectively detecting the emission from the second portion of circuitry. In one implementation, a phase relationship with the stimulation is used to select an emission from the second portion of circuitry. When a selected portion of circuitry is stimulated, the response from the second portion can be delayed for a certain amount of time, depending upon the design of the circuit being tested. The delay, or phase shift, for a particular circuit is determined using design data or via testing. Emissions having a phase shift equal to that delay are selectively detected. For example, when a laser is used to stimulate a selected portion of circuitry, a portion of the laser is reflected, and an emission is generated at a second portion of circuitry. The phase of the reflected laser light is different from that of the emission, and the phase difference is used to select emissions from the second portion. This is particularly advantageous when using pulsed stimulation, here a pulsed laser, but adaptable for various types of stimulation as discussed in connection with other example embodiments herein.

Another way in which to selectively detect an emission from the second portion of circuitry includes using an ion-selective counter to selectively detect ions from the second portion of circuitry. Ion emissions from the second portion of circuitry have characteristics related to the stimulation and to the type of circuitry from which they are emitted. For example, the type of material from which emissions originate affects the emissions. In addition, emissions from the second portion of circuitry are, depending upon the particular circuitry, delayed from emissions from the selected circuitry being stimulated, as well as from reflections from other portions of the die. This delay is used to selectively detect ions from the second portion of circuitry by selectively counting ions emitted from the second portion. As with the laser discussed hereinabove, the stimulation can be pulsed in a manner that facilitates the selective counting.

The external emission from the second portion of circuitry is generated in a variety of manners, depending upon the desired type of analysis and the equipment available for use. For example, a multitude of stimulation devices, such as a laser, an electron beam, an ion beam, an optical beam, a signal generator or a heat source are suitable for use in connection with the present invention. The stimulation devices are used to create conditions suitable for analysis, such as by simulating operating conditions, simulating a failure condition or a continuous loop operating condition. One or more of conduction, capacitance, voltage induction, heat transfer or other types of energy transfer to the second portion of circuitry is used to generate the response.

Substrate is removed from the die prior to analysis in another example embodiment of the present invention. This is particularly useful for post-manufacturing analysis. The substrate can be removed, for example, using typically-available substrate removal methods and devices, such as using a focused ion beam (FIB), a laser etching device, or an etch chamber having an etch gas and used in combination with a masking step. In one particular example embodiment, back side silicon substrate is globally removed from a die using a polishing process, such as chemical-mechanical polishing. The polishing process is followed by a locally thinning process that is used to locally thin the die in a selected region. This is useful for locally thinning the die in a region over a selected portion of circuitry to be stimulated.

In one particular example embodiment of the present invention, the substrate removal is controlled as a function of the detected response from the portion of the circuitry being indirectly stimulated. As substrate is being removed, the selected portion of circuitry is stimulated, and an external emission from the second circuit portion is detected. The emission is related to the thickness of substrate remaining. In one implementation, the emission varies as the amount of substrate over the selected circuitry is reduced, and in another implementation, the smission varies as the amount of substrate over the secondary circuitry is reduced. For example, when the selected portion is being stimulated using a laser beam, the amount of substrate through which the beam must pass varies as substrate is removed. This variance affects the intensity of the laser incident upon the selected circuitry and, in turn, affects the emission generated at the second portion of circuitry. In addition, when the emission detected from the second portion of circuitry includes a photoemission, characteristics such as the intensity of the photoemission are affected by the amount of substrate remaining over the second portion. These variances are used to detect the amount of substrate remaining in the die, and the substrate removal is controlled therefrom. As discussed hereinabove, the use of a filter to reduce or eliminate undesirable responses enhances the applicability of the present invention to substrate removal.

FIG. 1 shows a semiconductor die 100 undergoing analysis, according to another example embodiment of the present invention. A stimulus 130 is applied to a portion 110 of circuitry in the die 100, and a detectable emission 140 is induced in portion 120 of circuitry in the die 100 via interconnect 112. Various related example embodiments include removing substrate from a portion of the die 100 to facilitate the stimulation of portion 110 and/or the detection of the emission 140 from circuit portion 120. The substrate removal may include, for example, exposing a probe region over the selected circuitry, such as by exposing a buried oxide (BOX) region of a semiconductor die having silicon-on-insulator (SOI) structure.

Figure 2:
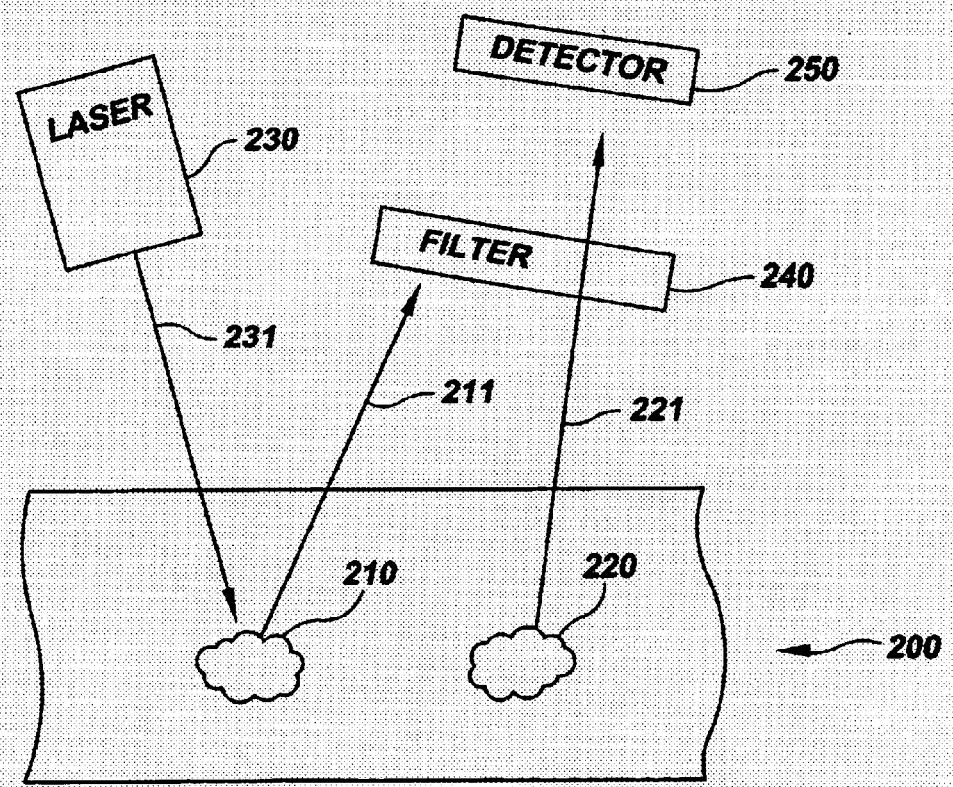
FIG. 2 is a semiconductor die undergoing analysis in an analysis arrangement, according to another example embodiment of the present invention.

FIG. 2 shows a semiconductor die 200 undergoing analysis, according to another example embodiment of the present invention. A laser device 230 is used to direct a laser beam 231 at a first portion of circuitry 210 in the die. The laser beam stimulates the first portion 210, and the stimulation induces an external emission 221 from a second portion of circuitry 220 in the die. In addition to inducing emission 221, the laser beam generates a response 211, such as a reflection or photoemission, from the first portion 210. A filter arrangement 240 is adapted to filter out some or all of the response 211 from the first portion 210, and to pass the emission 221 from the second portion 220. The passed emission 221 is detected at a detection arrangement 250, such as a photodetector, and is used to analyze the die.

In one implementation, the laser beam 231 is used to generate laser-induced voltage alteration (LIVA) in the die.

The laser beam wavelength is selected so that electron-hole pairs are generated in the circuitry. When the laser hits the circuitry, energy from the photons is absorbed, and one or more electrons, having the absorbed energy, "jump" a valence level, leaving a hole that causes an electrical characteristic of the circuitry to change. One type of laser beam suitable for generating such hole pairs is one having a wavelength of about 1064 nanometers. The electron-hole pairs create a voltage alteration that induces the emission 221 from the second circuit portion 220. In this instance, the filter 240 includes a high pass filter that is adapted to inhibit light having a wavelength less than about 1100 nanometers. In this way, reflected portions of the response 211 having the 1064 nanometer wavelength are filtered out, and the induced emission, such as a photoemission, passes through the filter 240 and is detected at the detector 250. The filter reduces or eliminates reflections and enables the detector 250 to obtain a response having reduced interference from sources other than the circuit.

In another implementation, the laser beam 231 is used to generate thermalinduced voltage alteration (TIVA) in the die. The laser beam wavelength is selected so that electron-hole pairs generation in the circuitry is inhibited while generating heat in the circuitry. One type of laser beam suitable for generating such TIVA is one having a wavelength of about 1300 nanometers. Similarly to LIVA, TIVA generates heat that creates a voltage alteration that induces the emission 221 in the second circuit portion 220. In this instance, the filter 240 includes a low pass filter that is adapted to inhibit light having a wavelength greater than about 1250 nanometers. In this way, reflected portions of the response 211 having the 1300 nanometer wavelength are filtered out, and the induced emission, such as a photoemission, passes through the filter 240 and is detected at the detector 250. The filter reduces or eliminates reflections and enables the detector 250 to obtain a response having reduced interference from sources other than the circuit.

In addition or as an alternative to the low-pass and high-pass filters described hereinabove, another example embodiment of the present invention includes using a notch filter that eliminates light having a wavelength in a selected range. For instance, a notch filter adapted to eliminate wavelengths of light in the range of 1000–1350 nanometers would reduce or eliminate reflections from lasers having a wavelength of about 1064 nanometers, as used to create LIVA, and a wavelength of about 1300 nanometers, as used to create TIVA.

In a more particular example embodiment of the present invention, the laser in FIG. 2 is pulsed. The pulsed laser generates an emission that resembles a waveform. The emission is detected and the corresponding waveform is used to evaluate a characteristic of the die. For example, the waveform may include information that can be correlated to an electrical characteristic of the circuitry, such as a logic state associated with a selected voltage, or a time constant associated with a change in voltage and the related logic state.

One or more of the example embodiments of the present invention, including those described hereinabove, can be used in connection or combination with a semiconductor tester that is adapted to introduce operating signals to the die. Various aspects of the stimulation of the die including LIVA, TIVA, and other approaches are performed while the die is being operated. Emissions from the second portion of circuitry are detected as a function of the stimulation and the operating signals. The emission is used to analyze the die, and the known operating conditions are used to correlate the analysis with a selected function of the die that is being analyzed.

In another example embodiment of the present invention, a non-defective die is analyzed in one or more of the manners as described hereinabove. Response data from the die is obtained for one or several circuit elements to be subsequently analyzed in a defective die. The data from the non-defective die is then stored and compared with data obtained from a die being analyzed. In one particular implementation, a series of test vectors are input to the non-defective die. The same signals are input to the defective die, and the response is compared. Variations in the response (e.g., the emission) are used to detect that the defective die is not operating properly.

Figure 3:
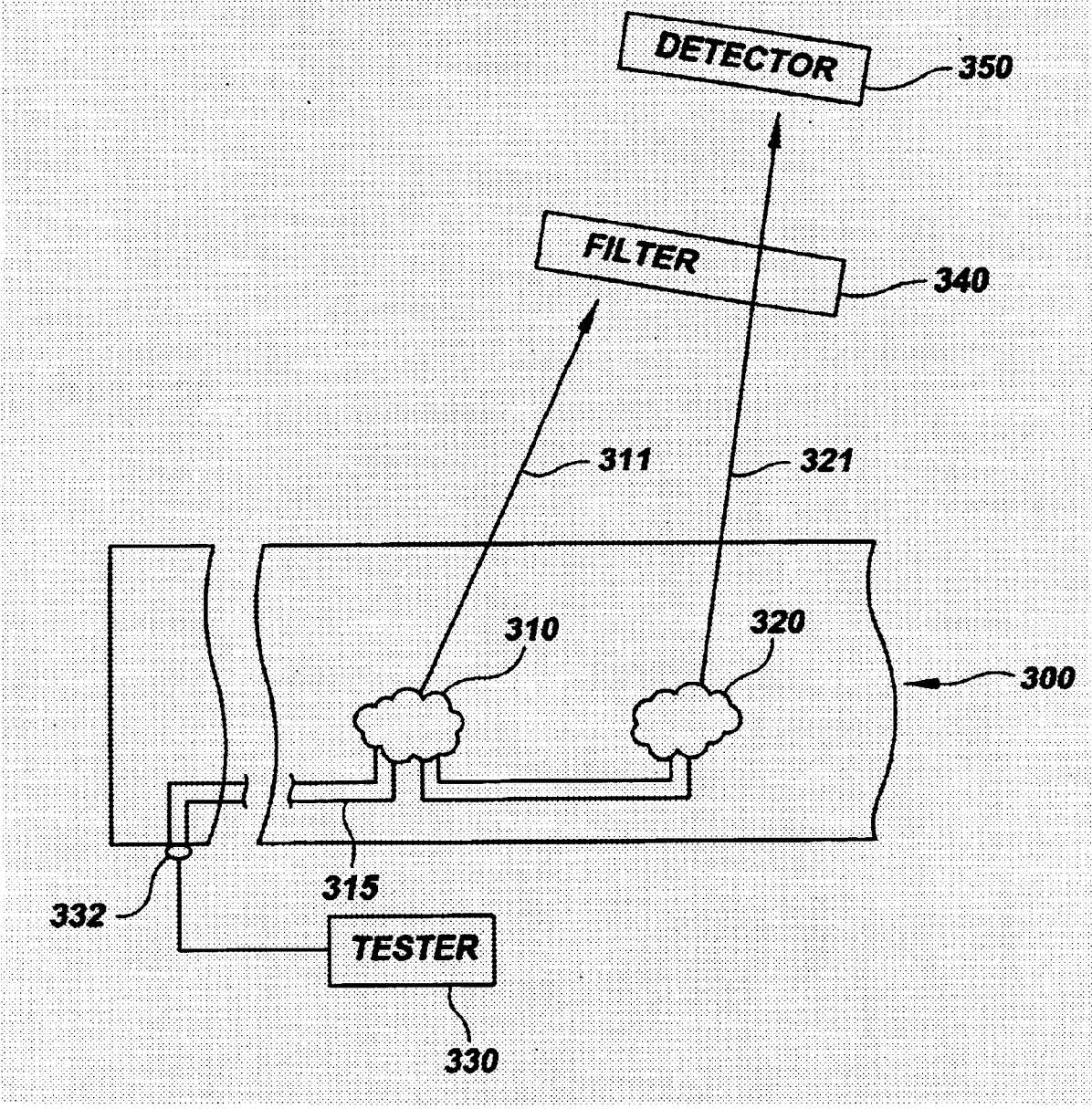
FIG. 3 is a semiconductor die undergoing analysis in an analysis arrangement, according to another example embodiment of the present invention.

FIG. 3 shows a semiconductor die 300 undergoing analysis, according to another example embodiment of the present invention. A tester 330 is electrically coupled to a selected portion of circuitry 310 via a pin connection 332 and interconnects 315. The tester is used to stimulate the selected portion 310, such as by applying a test vector or other signal that represents a selected operating condition for the die. The stimulation caused a second portion of the die 320 to generate an emission 321, such as a photoemission. The emission 321 is passed through a filter 340 and detected at a detector 350. A response is also generated at the selected circuitry 310: however, the filter 340 is adapted to reduce, eliminate or otherwise prevent the response from reaching the detector 350. In this manner, the emission 321 is detected having less interference than would be present, had the response 311 not been filtered.

According to another example embodiment of the present invention, FIG. 4 shows a system 400 adapted to indirectly stimulate and generate an emission from a secondary portion of circuitry in a semiconductor die 410. The system includes a die holder 420 adapted to couple to and hold the die. A tester 450 is electrically coupled to the die holder 420 and, through circuitry in the die holder, to the die 410. The tester is adapted to obtain a response from the die and/or to send a signal to the die, such as an operating vector or other signal. A stimulation device 430 is adapted to stimulate a selected portion of circuitry in the die 410 and, indirectly, stimulate a second portion of circuitry in the die. The stimulation device includes one or more of: a FIB, an electron beam device, a laser device, ion beam device and a heating device. A detector 440 is adapted to detect an emission 415 from the die and, in one implementation, includes a filter adapted to reduce or eliminate a response or responses from the first stimulated portion of the device.

The system 400 optionally includes a controller 460 adapted to control the stimulation device. In one implementation, the controller is adapted to receive electrical characteristics of the die 410 via the detector 440 and interpret those characteristics to analyze the die. The controller 460 can also be programmed to control the stimulation device 430 for obtaining various results. For instance, the device can be pulsed rapidly to obtain a waveform response from the detector. The pulsing can be generated in sequences having a duration in the microsecond, picosecond or even shorter range. This is particularly useful for obtaining waveforms from high frequency applications, and for obtaining a capacitive measurement in response to a particular input signal. The controller is also communicatively coupled to the tester 450, and is adapted to provide control signals to, and receive response and status signals from the tester.

The controller 460 is further optionally coupled to a display 465 adapted to provide information indicative of the emission from the detector 440. For example, the display can be used to display a waveform response from the die in the pulsed application described above. In addition, the display can be used to display an image of the die having variations in contrast related to the response detected.

In another example embodiment of the present invention (not shown), the system 400 includes a substrate removal device adapted to remove substrate from the die 410 and form an exposed region having a probe area. In one implementation, the substrate removal device includes a FIB, and in another implementation, the substrate removal device includes a laser etching device. The exposed region is formed having a depth that is sufficient to facilitate inducing an emission via the stimulation device 430.

While the present invention has been described with reference to several particular example embodiments, those skilled in the art will recognize that many changes may be made thereto without departing from the spirit and scope of the present invention, which is set forth in the following claims.

What is claimed is:

1. A method for analyzing a semiconductor die having circuitry used for functions nonspecific to circuit testing, the method comprising:

stimulating a first portion of the circuitry within the die;

inducing an external emission from a second portion of the circuitry in the die, as a function of the stimulation; and selectively detecting the emission from the second portion of the circuitry and analyzing the die therefrom.

2. The method of claim 1, wherein inducing an external emission includes using at least one of: an electron beam, an ion beam, a laser, a signal generator and a heat source.

3. The method of claim 1, wherein inducing an external emission includes inducing a response as a function of an electrical characteristic of a source/drain region in the die.

4. The method of claim 1, wherein analyzing the die includes post-manufacturing analysis.

5. The method of claim 1, wherein selectively detecting the emission includes selecting emissions from the second portion of circuitry based on a phase relationship with the stimulation of the first portion of circuitry.

6. The method of claim 1, wherein selectively detecting the emission includes using an ion-selective counter to selectively detect ions from the second portion of circuitry.

7. A method for analyzing a semiconductor die, the method comprising:

stimulating a first portion of circuitry within the die;

inducing a detectable response from a second portion of circuitry in the die, the response being induced as a function of the stimulation;

selectively detecting the emission from the second portion of circuitry and analyzing the die therefrom; and inhibiting a response from the first portion of circuitry.

8. The method of claim 7, wherein inhibiting a response from the first portion of circuitry includes filtering at least one of: an emission and a reflection from the first portion.

9. The method of claim 7, wherein stimulating a first portion of circuitry within the die includes directing a laser at the first portion, and wherein inhibiting a response includes filtering a reflection of the incident laser.

10. The method of claim 9, wherein filtering a reflection includes using at least one of: a notch filter, a high pass filter and a low pass filter.

11. The method of claim 9, wherein directing the laser includes pulsing the laser, and wherein analyzing the die includes obtaining a waveform response to the pulsed laser.

12. The method of claim 11, further comprising coupling a power supply to the die and inputting electrical signals to the die to generate a response.

13. The method of claim 12, wherein inputting electrical signals includes inputting signals known to induce a failure in the die.

14. The method of claim 12, wherein inputting electrical signals includes inputting signals in a continuous loop.

15. The method of claim 7, wherein analyzing the die includes removing substrate from the die as a function of the detected emission, and wherein the detected emission is related to a thickness of substrate remaining in the die.

16. A method for analyzing a semiconductor die having circuitry used for functions nonspecific to circuit testing, the method comprising:

stimulating a first portion of the circuitry within the die;

inducing an external emission from a second portion of the circuitry in the die including inducing a change in an electrical state of the second portion of the circuitry, as a function of the stimulation; and selectively detecting the emission from the second portion of the circuitry and analyzing the die therefrom.

17. The method of claim 16, wherein inducing a change in an electrical state includes inducing at least one of: a current change, a voltage change and a resistive change.

18. A method for analyzing a semiconductor die, the method comprising:

stimulating a first portion of circuitry within the die;

inducing an external emission from a second portion of circuitry in the die, as a function of the stimulation;

selectively detecting the emission from the second portion of circuitry and analyzing the die therefrom; and inducing an external emission from a non-defective die in the same manner as the die being analyzed, the non-defective die having the same design as the die being analyzed, and comparing the analysis of the dies.

19. A system for analyzing a semiconductor die having circuitry used for functions nonspecific to circuit testing, the system comprising:

means for stimulating a first portion of the circuitry in the die and inducing an external emission from a second portion of the circuitry in the die as a function of the stimulation;

means for detecting the emission and analyzing the die therefrom.

20. A system for analyzing a semiconductor die, the system comprising:

means for stimulating a first portion of circuitry in the die and inducing an external emission from a second portion of circuitry in the die as a function of the stimulation;

means for detecting the emission and analyzing the die therefrom; and means for inhibiting a response from the first portion of circuitry.

21. A system for analyzing a semiconductor die, the system comprising:

a stimulation arrangement adapted to stimulate a first portion of circuitry in the die and induce an external emission from a second portion of circuitry in the die as a function of the stimulation; and a detector adapted to detect the emission and, therefrom, analyze the die.

22. The system of claim 21, further comprising a substrate removal arrangement adapted to remove substrate from the semiconductor die and expose a region of the die to be used for stimulating the die.

23. The system of claim 21, further comprising a substrate removal arrangement adapted to remove substrate from the die in response to a detected emission at the detector.

24. The system of claim 21, wherein the stimulation arrangement includes at least one of: a signal generator, an optical beam, an ion beam, an electron beam and a heating device.

25. A system for analyzing a semiconductor die, the system comprising:

a stimulation arrangement adapted to stimulate a first portion of circuitry in the die and induce an external emission from a second portion of circuitry in the die as a function of the stimulation;

a detector adapted to detect the emission and, therefrom, analyze the die; and a filter adapted to inhibit a response from the first portion of circuitry.

26. The system of claim 25, wherein the filter includes at least one of: an optical notch filter, an optical high pass filter and an optical low pass filter.

* * * * *

UNITED STATES PATENT AND TRADEMARK OFFICE
CERTIFICATE OF CORRECTION

PATENT NO. : 6,870,379 B1
DATED : March 22, 2005
INVENTOR(S) : Davis et al.

It is certified that error appears in the above-identified patent and that said Letters Patent is hereby corrected as shown below:

Column 4,
Line 22, "smission" should read -- emission --.

Column 5,
Line 21, "thermalinduced" should read -- thermal-induced --.

Signed and Sealed this

Twenty-first Day of June, 2005

JON W. DUDAS
*Director of the United States Patent and Trademark Office*